United States Patent [19]
Miyatake et al.

[11] Patent Number: 4,843,596
[45] Date of Patent: Jun. 27, 1989

[54] SEMICONDUCTOR MEMORY DEVICE WITH ADDRESS TRANSITION DETECTION AND TIMING CONTROL

[75] Inventors: Hideshi Miyatake; Masaki Kumanoya; Hideto Hidaka; Yasuhiro Konishi; Katsumi Dosaka; Hiroyuki Yamasaki; Masaki Shimoda; Yuto Ikeda; Kazuhiro Tsukamoto, all of Itami, Japan

[73] Assignee: Mitsubishi Denki Kabushiki Kaisha, Japan

[21] Appl. No.: 124,554

[22] Filed: Nov. 24, 1987

[30] Foreign Application Priority Data

Nov. 29, 1986 [JP] Japan .................. 61-284849

[51] Int. Cl.$^4$ .............................................. G11C 8/00
[52] U.S. Cl. .............................. 365/233.5; 365/189.08
[58] Field of Search ................... 365/189, 230, 233

[56] References Cited

U.S. PATENT DOCUMENTS

| 4,272,832 | 6/1981 | Ito | 365/233 |
| 4,337,525 | 6/1982 | Akatsuka | 365/233 |
| 4,558,435 | 12/1985 | Hsieh | 365/233 |
| 4,656,612 | 4/1987 | Allan | 365/194 |
| 4,739,502 | 4/1988 | Nozaki | 365/233 |

FOREIGN PATENT DOCUMENTS 61-165884 7/1986 Japan.

OTHER PUBLICATIONS

"Development Technique and Further Development of Hitachi Mega-Bit DRAM", Katsuyuki Sato (Hitachi), May 22-23, 1985.

Primary Examiner—Terrell W. Fears
Assistant Examiner—Glenn A. Gossage
Attorney, Agent, or Firm—Leydig, Voit & Mayer

[57] ABSTRACT

A novel semiconductor memory device includes an address detection circuit that produces a short-width pulse in response to the detection of an address change. A column decoder-activating signal generator detects the start of the short-width pulse and in response generates a column decoder-activating signal. A second detection circuit detects the conclusion of the short-width pulse and generates a second pulse that triggers a preamplifier-activating signal that activates a preamplifier and latches the data that is present on the input/output line. A reset signal generator produces a reset signal to deactivate the column decoder-activating signal and to delay the preamplifier-activating signal. The preamplifier-activating signal generator and the reset signal generator are reset while the first pulse is output.

1 Claim, 7 Drawing Sheets

SEMICONDUCTOR MEMORY DEVICE WITH ADDRESS TRANSITION DETECTION AND TIMING CONTROL

FIELD OF THE INVENTION

The present invention relates to a semiconductor memory device capable of static operation, and more particularly to an improvement in the static operation thereof.

BACKGROUND ART

Recently, a static column mode capable of realizing a high speed read out operation with a reduced cycle time has been implemented in a dynamic random acess memory (DRAM). In this static column mode initial data is accessed at the usual operation timing, and thereafter a high speed access is realized by activating a column address system as in the case of static random access memory (SRAM). The column address system is constituted by a static circuit which is not activated prior to operation. The I/O bit line is pulled up to a predetermined DC voltage by an I/O load, but does not fully swing between source voltage Vcc and ground at the read out operation. In this arrangement, however, there is a disadvantage in that a DC current always flows from the I/O load to the selected bit line. To overcome this disadvantage, a pulse signal operation system in which the selected column decoder is activated only in a predetermined time period during a read out operation is implemented.

Figure 4:
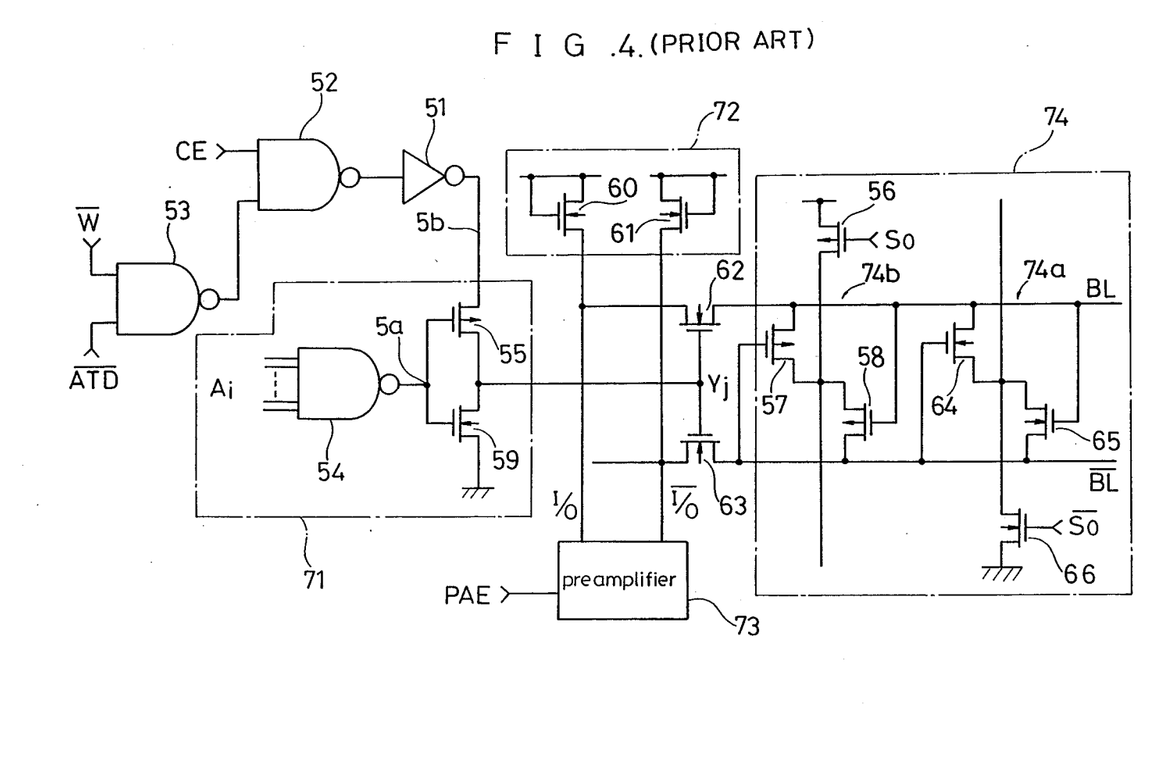
FIG. 4 is a diagram of a prior art column decoder section circuit.

FIG. 4 shows a typical column decoder section of such a pulse signal operation system circuit. In FIG. 4, reference numeral 51 designates an inverter, numerals 52, 53, and 54 designate NAND gates, numerals 55, 56, 57, and 58 designate P channel MOS transistors, and numerals 59, 60, 61, 62, 63, 64, 65, and 66 designate N channel MOS transistors. Reference numeral 71 designates a selected column decoder, numeral 72 designates an I/O load, and numeral 73 designates a preamplifier to which the output of the I/O load 72 is connected through a latch. Reference numeral 74 designates a sense amplifier, reference characters BL, $\overline{BL}$ designate a bit line pair, and a characters I/O and $\overline{I/O}$ designate a complementary I/O line pairs.

Reference character CE designates a row system signal, which is activated after the sense operation. Reference character $\overline{W}$ designates a write in system signal, and reference character $\overline{ATD}$ designates a pulse signal that is the output of an address transition detection circuit. This pulse signal ATD corresponds to a column decoder activating signal. Furthermore, reference character PAE designates a preamplifier activating signal, which is a signal having the same timing characteristics as the $\overline{ATD}$ signal. Reference character So designates an activating signal for the N channel sense amplifier 74a, and reference character So designates an activating signal for the P channel sense amplifier 74b. Reference character Ai designates a column address, and reference character Yj designates an output of the column decoder.

Figure 5:
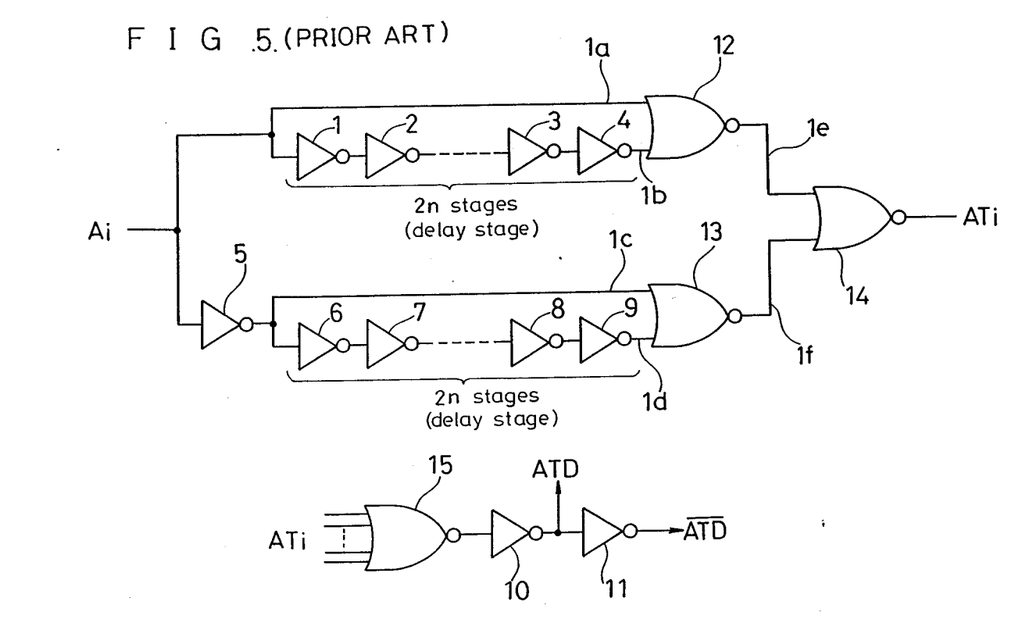
FIG. 5 is a diagram of a prior art address transition detection circuit.

FIG. 5 shows an address transition detection circuit of a prior art semiconductor memory device which is designed to detect the transition of an address and to output a pulse signal upon that detection. In FIG. 5, reference numerals 1 to 11 designate inverters, reference numerals 12 to 15 designate NOR gates, and reference character Ai designates a column address. The inverters 1 to 4 and 6 to 9 respectively constitute delay stages.

The operating principle of the device of FIG. 5 will be described with reference to FIG. 6 which shows waveforms at the respective terminals of FIG. 5.

When the column address Ai is at low level, the terminal 1e is at high level because the terminals 1a and 1b are at low level, and the terminal 1f is at low level because the terminals 1c and 1d are at high level, and the output ATi is at low level. When the column address Ai changes to high level, the terminal 1a becomes high level, and the terminal 1e becomes low level. Therefore, the output ATi becomes high level. Thereafter, terminals 1c and 1d become low level, and the terminal 1f becomes high level. Therefore the output ATi becomes low level, and a pulse signal is output as the output ATi. The pulse signal ATi is also output when the column address Ai changes from high level to low level but in reverse to the above-described transition. The width of the high level of the output ATi can be adjusted depending on the number of delay stages. This width is established to be longer than that required for the output to be latched to the preamplifier (about 20 ns). The respective outputs ATi are input to the NOR gate 15, and a monopulse signal $\overline{ATD}$ is generated.

The operating principle of the circuit of FIG. 4 will be described with reference to FIG. 7.

Now suppose that the voltages of the bit line pair BL and $\overline{BL}$ are fixed to Vcc, the source voltage, and ground, respectively, after the sensing operation is completed and during a read out operation.

When the column address signal Ai makes a transition, the transition is detected and the ATD and $\overline{ATD}$ signal become high level and low level, respectively. Because the signals $\overline{W}$ and CE are both at high levels, the terminal 5b of FIG. 4 becomes high level. At the same time, the column decoder 71 is selected and the terminal 5a becomes low level. Thus, the output of the column decoder Yj becomes high level, and the data of bit line pair BL and $\overline{BL}$ flow into the I/O line pair I/O and $\overline{I/O}$. Thereafter, the preamplifier activating signal PAE becomes high level synchronized with the $\overline{ATD}$ signal, and the data of the I/O line pair is latched in to the preamplifier. Thereafter, when the $\overline{ATD}$ signal is restored to high level, Yj becomes low level, the I/O line pair and the bit line pair are cut off from each other, and no DC current flows through the I/O load.

In the prior art semiconductor memory device with such a construction, there is a disadvantage in that the read out operation cannot take place when the same address is changed again during a time period shorter than the delay time of the delay stage of the address transition detection circuit.

The mechanism of this disadvantage will be described in detail.

Figure 6:
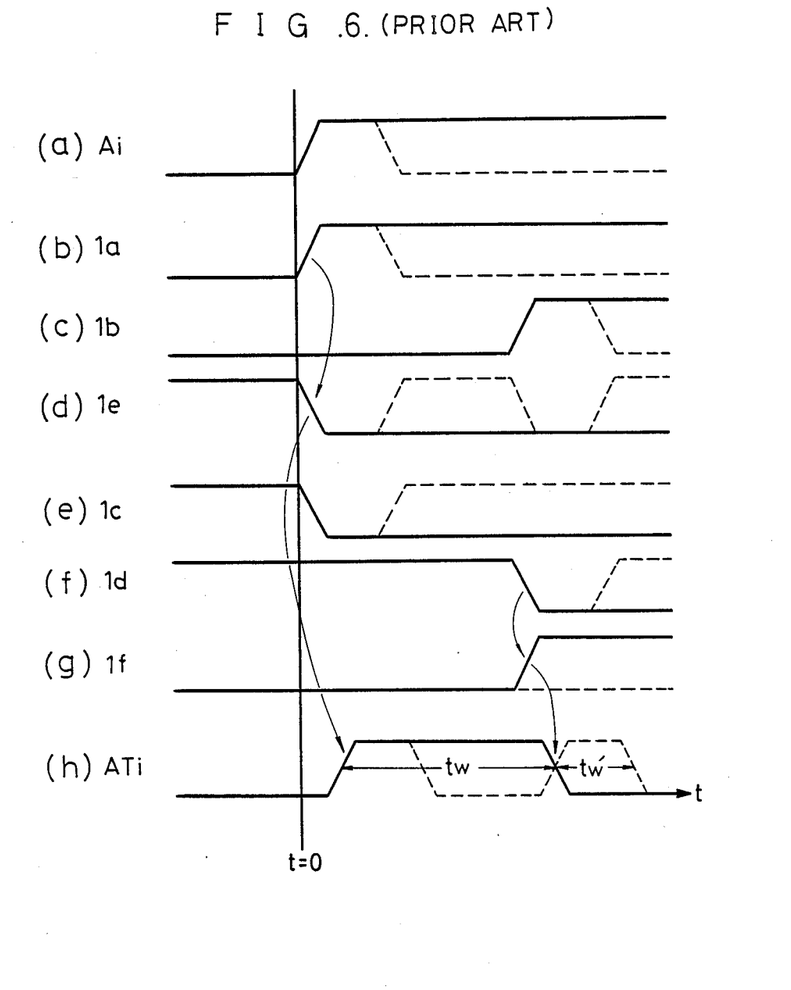
FIG. 6 is a diagram of various waveforms exemplifying the operation of the circuit of FIG. 4.

In FIGS. 5 and 6, when the address Ai changes as shown by broken lines in FIGS. 5 and 6, the terminal 1a becomes low level, and the terminal 1e becomes high level. Therefore, the output ATi becomes low level. When the terminal 1b becomes high level, the terminal 1e becomes low level and the output ATi becomes high level. Thereafter the terminal 1b becomes low level and the terminal 1e becomes high level, again making the output ATi low level. After all, the width of the effective high level of the ATi is shortened from tw to tw'.

Figure 7:
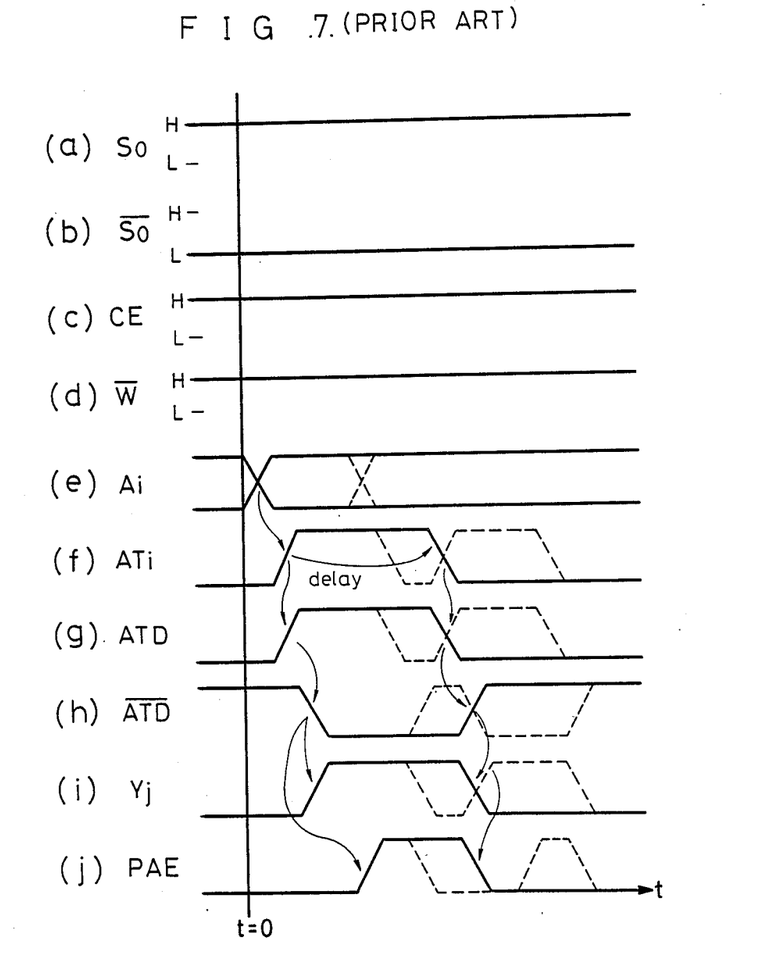
FIG. 7 is a diagram of various waveforms exemplifying the operation of the circuit of FIG. 5.

The operation waveforms of the respective portions when the signal ATi makes such a change are shown by broken lines in FIG. 7.

In the prior art semiconductor memory device of such a construction, when the address Ai is changed again during a short time period, the efficient width of the ATi is reduced. Therefore the pulse width of the preamplifier activating signal PAE, which has the same timing as the ATD signal, becomes narrower, thereby resulting in a disadvantage that data cannot be read out.

SUMMARY OF THE INVENTION

An object of the present invention is to provide an improved semiconductor memory device having a column system circuit of pulse signal operation in which effective data can be read out, even when a change of the same address occurs twice during a short time period.

Other objects and advantages of the present invention will become apparent from the detailed description given hereinafter; it should be understood, however, that the detailed description and specific embodiments are given by way of illustration only, since various changes and modifications within the spirit and scope of the invention will become apparent to those skilled in the art from this detailed description.

According to the present invention, there are provided a first detection circuit which detects an address transition outputs a short width first pulse signal, a column decoder activating signal generator which detects the start of this pulse thereby activating the column decoder, a second detection circuit which detects the conclusion of this first pulse, thereby generating a preamplifier activating signal and, a reset signal generator which generates a reset signal to deactivate the preamplifier activating signal and the column decoder activating signal. A delayed preamplifier activating signal is used for the reset signal. The preamplifier activating signal generator and the reset signal generator are designed to be reset while the first pulse signal is output. Accordingly, even when a change of the same address occurs twice within a short time, the disadvantage of not being able to perform a read out operation is eliminated.

DETAILED DESCRIPTION OF THE PREFERRED EMBODIMENTS

Figure 1:
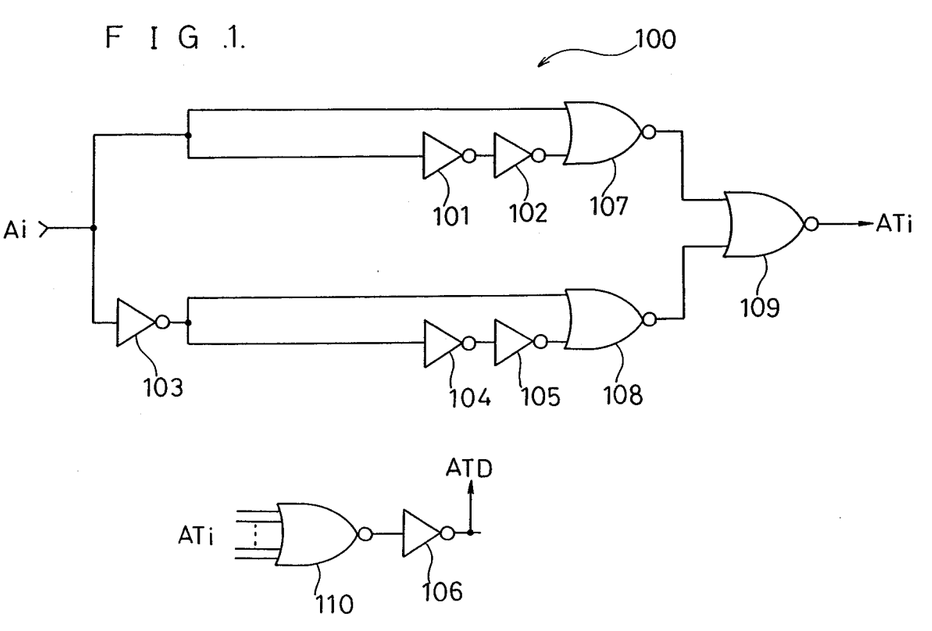
FIG. 1 is a diagram of a detection circuit of a semiconductor memory device as an embodiment of the present invention.

In order to explain the present invention in detail, reference will be particularly made to FIG. 1.

FIG. 1 shows an address transition detection circuit (first detection circuit) of a semiconductor memory device as an embodiment of the present invention. In FIG. 1, reference numerals 101 to 106 designate inverters, and the reference numerals 107 to 110 designate NAND gates.

Figure 2:
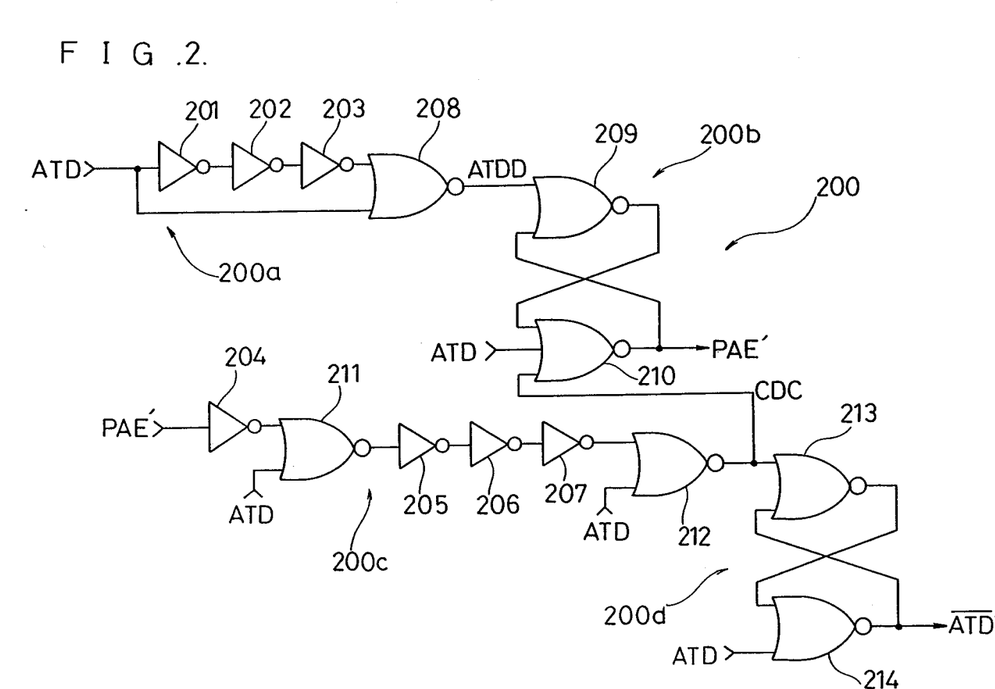
FIG. 2 is a diagram of a column system control circuit of the above-described embodiment.

FIG. 2 shows a column system control circuit 200 of the above-described semiconductor memory device. In FIG. 2, reference numerals 201 to 207 designate inverters, reference numerals 208 to 214 designate NOR gates, and numeral 200a designates a second detection circuit comprising inverters 201 to 203 and NOR gate 208. Reference numeral 200b designates a preamplifier activating signal generator comprising NOR gates 209 and 210. Reference numeral 200c designates a reset signal generator comprising inverters 204 to 207, NOR gates 211 and 212, and reference numeral 200d designates a column decoder activating circuit comprising NOR gates 213 and 214.

Furthermore, reference character ATDD designates a single pulse signal (second pulse) which is output at the conclusion of the generation of the pulse output (first single pulse) ATD, which is the output of the address transition detector. Reference character PAE' designates a preamplifier activating signal which is generated when the ATDD is received. Reference character CDC designates a delay of PAE' signal which is a reset signal for deactivating the preamplifier and the column decoder after the preamplifier latches the data. Reference character $\overline{ATD}'$ designates a column decoder activating signal.

The column decoder section circuit is the same as that of the prior art circuit shown in FIG. 4. The operation of the circuits FIGS. 1 and 2 will be described with reference to the waveforms shown in FIG. 3.

FIG. 1 shows a circuit which has a reduced number of delay stages as compared with FIG. 5, and it is easily supposed that a minute pulse width that is shorter than 5 ns is obtained.

In FIG. 2, when the output ATD of the address transition detection circuit becomes high level in response to a transition of an address, the column decoder activating signal $\overline{ATD}'$ becomes low level, and the output Yj of the selected column decoder becomes high level. Then, the data on the bit line pair is transfered to the I/O line pair. Thereafter, when the ATD signal becomes low level, it is detected and the ATDD signal becomes high level. Furthermore, the PAE' signal, which is the preamplifier activating signal becomes high level in response to this output, and the single pulse reset signal CDC becomes high level because of the delay of the PAE' signal for latching the data on I/O line pair to the preamplifier. Due to this signal, $\overline{ATD}'$ becomes high level, and PAE' becomes low level.

A single pulse operation of a column system circuit is thus enabled in the present invention.

Figure 3:
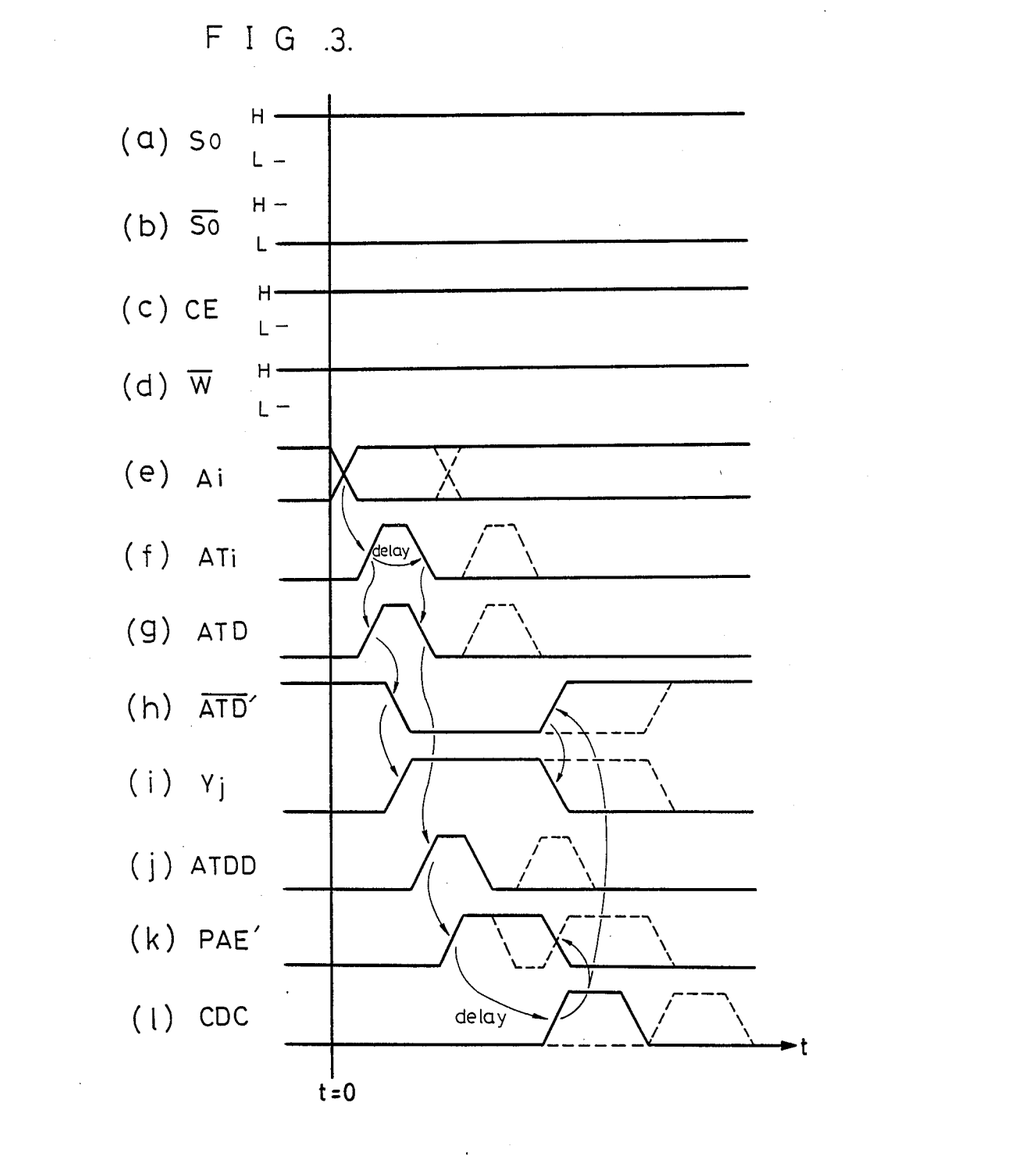
FIG. 3 is a diagram of various waveforms exemplifying the operation of the circuits of FIGS. 1 and 2.

Herein, the operation in which the same address is changed again in a short time is shown in FIG. 3 by dotted lines. As the pulse width of the ATD signal is short, the address transition detection circuit 100 again generates the ATD signal in accordance with the second address change. Then, because the ATD signal is high level, the preamplifier activating signal generator and the reset signal generator are reset, and the PAE' signal which has arisen in accordance with the first address change is restored to low level. Accordingly, the PAE' signal at this time has a short pulse width, which enables an effective data read out operation. When an ATD signal is generated in accordance with the second address change, the second detection circuit 200a detects the same and generates an ATDD signal. Thereafter, the reset signal generator will not be reset, and similarly as the description of the prior art operation, a normal operation follows. A PAE' signal of a sufficiently large width is obtained, preventing the possibility of not being able to perform a of read out operation.

In the above-description, only the read out operation was mentioned, but the present invention can also be applied to a write-verify mode, that is, a mode for reading out the written data for inspection, with the same effects as described above.

In the above-described embodiment, a dynamic RAM capable of a static column mode operation is described, but the present invention can also be applied to a static RAM with the same effects as described above.

What is claimed is:

1. A semiconductor memory device receiving an address signal providing data on an I/O line, said memory device comprising:

a first detection circuit for detecting an address transition and for generating a short-width first pulse signal in response;

a column decoder-activating signal generator for detecting the start of generation of said first pulse signal and for generating a column decoder-activating signal in response;

a second detection circuit for detecting the conclusion of said first pulse signal and for generating a second pulse siganl in response;

a preamplifier-activating signal generator for generating a preamplifier-activating signal to activate a preamplifier which amplifies and latches the data on said I/O line upon receipt of said second pulse signal; and a reset signal generator for generating a reset signal to deactivate said column decoder-activating signal and to delay said preamplifier-activating signal;

said preamplifier-activating signal generator and said reset signal generator being reset while said first pulse signal is output.

* * * * *